United States Patent
Pham (10) Patent No.: US 6,803,813 B1
(45) Date of Patent: Oct. 12, 2004

(54) TIME CONSTANT-BASED CALIBRATION CIRCUIT FOR ACTIVE FILTERS

(75) Inventor: Tien Ke Pham, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/420,494

(22) Filed: Apr. 22, 2003

(51) Int. Cl.[7] ............................................. H04B 1/10
(52) U.S. Cl. ................................. 327/553; 327/379
(58) Field of Search ................................. 327/311, 379, 327/552–559

(56) References Cited

U.S. PATENT DOCUMENTS

| | | | | |
|---|---|---|---|---|
| 5,187,445 A | * | 2/1993 | Jackson | 327/553 |
| 5,345,119 A | * | 9/1994 | Khoury | 327/553 |
| 6,097,244 A | * | 8/2000 | Chen | 327/553 |
| 6,710,644 B2 | * | 3/2004 | Duncan et al. | 327/558 |

OTHER PUBLICATIONS

Schaumann et al., The Problem of On–Chip Automatic Tuning in Continuous–Time Integrated Filters, IEEE Proc. International Symposium on Circuits and Systems, May 1989, pp. 106–109.

Park et al., Design of a 4–MHz Analog Integrated CMOS Transconductance–C Bandpass Filter, IEEE Journal of Solid–State Circuits, vol. 23, No. 4, Aug. 1988, pp. 987–996.

Bliss et al., In Situ Tuning Monolithic Continuous Time Leapfrog Filters, Proceedings of the 35th Midwest Symposium, Aug. 1992, pp. 938–941, vol. 2.

Bliss et al., High Precision in Situ Tuning of Monolithic Continuous Time Leapfrog Filters, IEEE International Symposium, May 10–13, 1992, pp. 843–846, vol. 2.

Nunes et al., Continuous–Time Leapfrog Filter with Precise Successive Approximation Tuning, IEEE International Synmposium on Circuits and Systems, vol. 2, May 1993, pp. 1271–1273.

Franca et al., Successive Approximation Tuning of Monolithic Continuous–Time Filters, Electronics Letters, Aug. 27, 1992, vol. 28, No. 18, pp. 1696–1697.

* cited by examiner

*Primary Examiner*—Timothy P. Callahan
*Assistant Examiner*—Terry L. Englund
(74) *Attorney, Agent, or Firm*—Vedder Price Kaufman & Kammholz, P.C.

(57) ABSTRACT

A time constant-based calibration circuit for tuning active filter circuitry. A time constant, e.g., corresponding to that of the active filter circuitry, within the calibration circuit is monitored and maintained at a desired value using successive approximation, with continuous calibration of the time constant performed using digital circuitry and a digital feedback signal to control the time constant.

20 Claims, 9 Drawing Sheets

TIME CONSTANT-BASED CALIBRATION CIRCUIT FOR ACTIVE FILTERS

BACKGROUND OF THE INVENTION

1. Field of the Invention

The present invention relates to active filters, and in particular, to calibration circuitry for tuning active filters.

2. Description of the Related Art

Increasing demands for wireless communications has accelerated developments of integrated circuits (ICs) in which all, or nearly all, necessary functions are integrated within one IC. Such single-chip implementations include filtering functions which have become increasingly critical and impose increasingly precise design requirements due to complex signal processing involved with high frequency digital signals.

Design and manufacturing of active continuous-time filters using IC technology poses many challenges due to the fact that integrated active filters require circuit components having values with high degrees of precision. Further, such precise component values must be maintained during the entire expected operating life of the circuitry. However, with normal variations in IC fabrication processes, normal operating temperature ranges and aging of components, such strict requirements are virtually impossible to maintain with little or no variations. Accordingly, it has become increasingly common to embed an automatic tuning mechanism within the IC as part of the overall circuitry.

Figure 1:
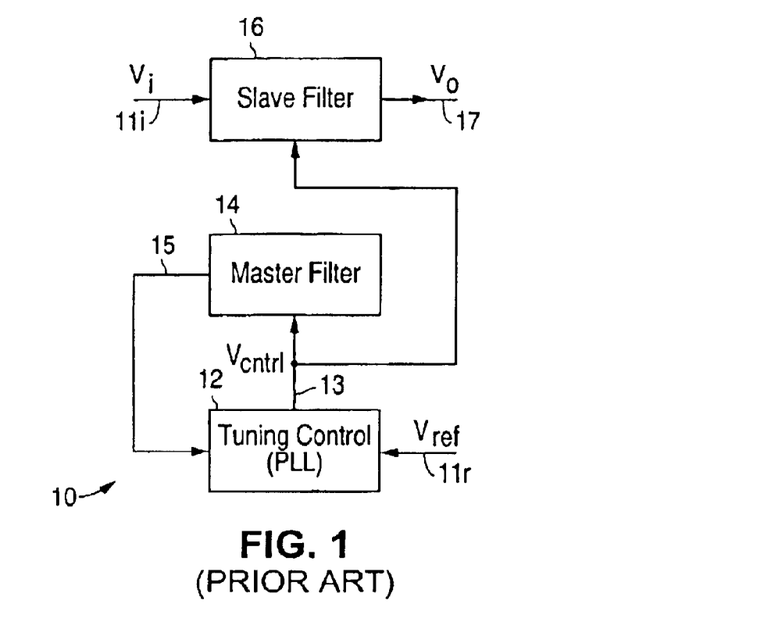
FIG. 1 is a functional block diagram of a conventional indirect filter tuning technique using analog circuitry.

Referring to FIG. 1, one conventional technique for tuning an active filter is based on indirect tuning where analog circuitry in the form of a phase-locked loop (PLL) provides the tuning mechanism. In accordance with well known conventional PLL techniques, the PLL 12 provides the control signal 13 to a master filter circuit 14 which, in turn, provides the feedback signal 15 to the PLL 12. Together, the PLL 12 and master filter 14 form an oscillator from which the feedback signal 15 is generated and intended to be phase-locked to the input reference signal 11r. When the PLL 12 has achieved a phase locked condition, i.e., locked to the phase of the reference signal 11r, the master filter is tuned to its desired frequency characteristics. This tuning state of the master filter 14 is reflected in the control signal 13 during phase lock. Accordingly, with this same control signal 13 applied to the slave filter 16, which is designed to match the master filter 14, the slave filter 16 also now has the desired frequency characteristics for filtering the incoming signal 11i to produce the desired output signal 17.

This tuning technique can be applied to a variety of integrated active filters, such as transconductance-capacitor ($G_m$-C) filters or metal oxide semiconductor field effect transistor (MOSFET) resistor-capacitor (RC) filters. However, two problems associated with this technique involve the high degree of matching required between the master 14 and slave 16 filters, as well as the performance of the analog PLL circuit 12. While problems associated with the matching of the master 14 and slave 16 filters can be minimized using direct tuning techniques, such as in-situ tuning, several forms of which are well known in the art, problems associated with the use of analog PLL circuitry 12 remain.

Figure 2:
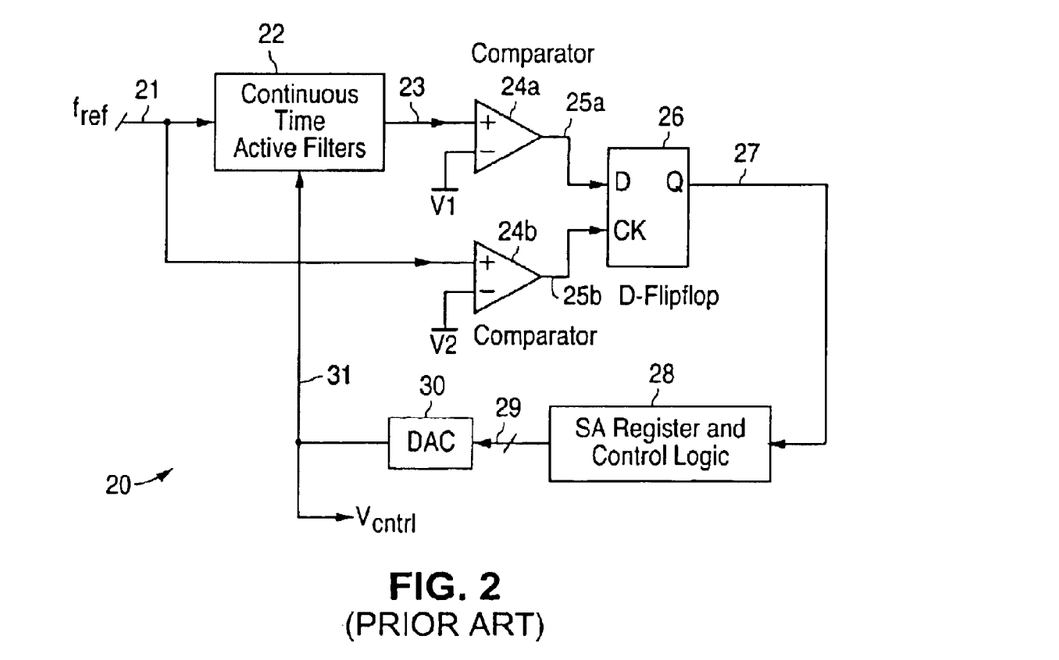
FIG. 2 is a schematic and functional block diagram of a conventional indirect filter tuning technique using digital circuitry.

Referring to FIG. 2, one technique which has been used to overcome limitations of analog circuitry uses digital circuits for performing the tuning operation. Using digital circuitry in an automatic tuning mechanism can be advantageous in that the performance and complexity of the tuning mechanism can be scaled in a parallel manner with advances in very large scale integration (VLSI) technology. One such implementation 20 uses a phase comparison successive approximation tuning technique with which the complexity and limitations of analog tuning circuitry are significantly reduced. As shown, an input reference signal 21 (with signal frequency $f_{ref}$) is filtered by a continuous time active filter 22 serving as the master filter. The filtered input signal 23 and the original input signal 21 are compared against respective threshold voltages V1, V2 in voltage comparators 24a, 24b. The resultant signal 25a based upon the filtered input signal 23 is latched in a flip-flop 26 in accordance with a clock signal 25b generated based upon the original input signal 21. The latched signal 27 is used by a successive approximation register and control logic 28 to produce a digital approximation signal 29 which is converted to an analog control signal 31 by a digital-to-analog converter (DAC) 30. This control signal 31 runes the master filter 22, and also provides the control signal $V_{contrl}$ for the slave filter (not shown).

All of the components in this implementation 20 are well known in the art. For example, the successive approximation register 28 can be the 74/54LS502 manufactured by National Semiconductor Corporation of Santa Clara, Calif.

Notwithstanding the potential for improved performance, such an implementation 20 does have its own problems. For example, with the need for two comparators 24a, 24b, any mismatches in the signal phases or other forms of incoherence between the input signals 23, 21 to the comparators 24a, 24b can result in erroneous data latching or phase jitter within the latched data signal 27, thereby causing the approximation signal 29, and therefore, the filter control signal 31, to have errors.

SUMMARY OF THE INVENTION

In accordance with the presently claimed invention, a time constant-based calibration circuit is provided for tuning active filter circuitry. A time constant, e.g., corresponding to that of the active filter circuitry, within the calibration circuit is monitored and maintained at a desired value using successive approximation, with continuous calibration of the time constant performed using digital circuitry and a digital feedback signal to control the time constant.

In accordance with one embodiment of the presently claimed invention, time constant-based calibration circuitry for tuning active filter circuitry includes tunable signal generator circuitry, signal comparison circuitry and successive approximation circuitry. The tunable signal generator circuitry, having associated therewith a first controllable time constant, responds to reception of a digital tuning control signal and first and second reference signals having mutually proportional respective DC values by providing a DC signal and an AC signal, wherein the DC signal has a magnitude responsive to the digital tuning control signal and related to the first controllable time constant, and the AC signal has a predetermined waveshape with a temporally variant magnitude. The signal comparison circuitry, coupled to the tunable signal generator circuitry, compares the DC and AC signals and in response thereto provides a digital result signal indicative of a difference between the DC and AC signal magnitudes. The successive approximation circuitry, coupled to the signal comparison circuitry, responds to reception of the digital result signal by providing the digital tuning control signal indicative of an approximation corresponding to a plurality of successive values of the digital result signal.

In accordance with another embodiment of the presently claimed invention, time constant-based calibration circuitry for tuning active filter circuitry includes tunable signal generator means, signal comparison means and successive approximation means. The tunable signal generator means, having associated therewith a first controllable time constant, is for responding to reception of a digital tuning control signal and first and second reference signals having mutually proportional respective DC values by generating a DC signal and an AC signal, wherein the DC signal has a magnitude responsive to the digital tuning control signal and related to the first controllable time constant, and the AC signal has a predetermined waveshape with a temporally variant magnitude. The signal comparison means is for comparing the DC and AC signals and in response thereto generating a digital result signal indicative of a difference between the DC and AC signal magnitudes. The successive approximation means is for responding to reception of the digital result signal by generating the digital tuning control signal indicative of an approximation corresponding to a plurality of successive values of the digital result signal.

In accordance with still another embodiment of the presently claimed invention, a method of using time constant-based calibration for tuning active filter circuitry includes:

receiving a digital tuning control signal;

receiving first and second reference signals having mutually proportional respective DC values;

generating a DC signal having a magnitude responsive to the digital tuning control signal and the first reference signal and related to a first controllable time constant;

generating an AC signal responsive to the second reference signal and having a predetermined waveshape with a temporally variant magnitude;

comparing the DC and AC signals and in response thereto generating a digital result signal indicative of a difference between the DC and AC signal magnitudes; and processing the digital result signal for generating the digital tuning control signal indicative of an approximation corresponding to a plurality of successive values of the digital result signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 3:
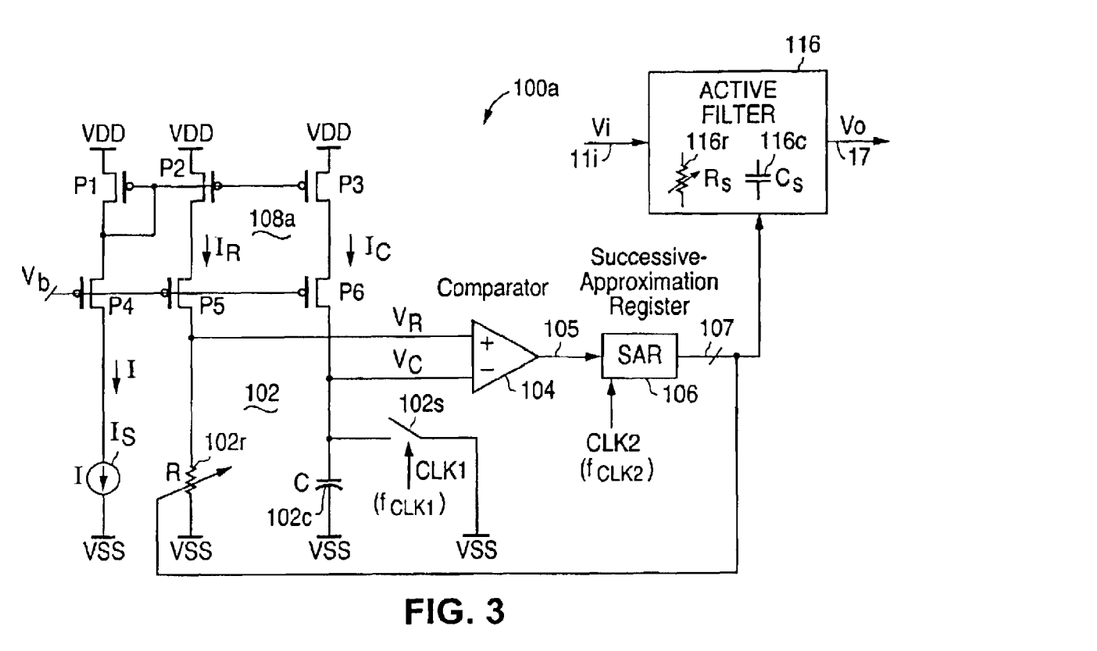
FIG. 3 is a schematic and functional block diagram of a time constant-based calibration circuit for tuning active filters in accordance with one embodiment of the present invention.
Figure 4A:
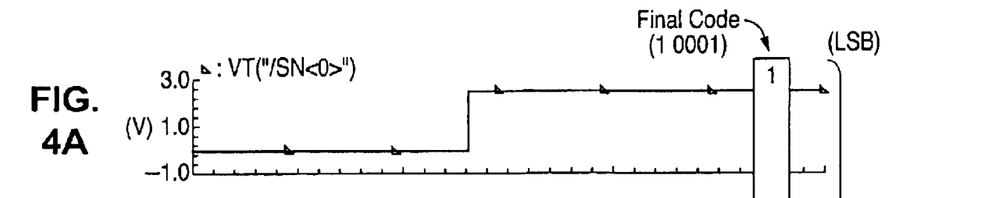
FIG. 4 contains signal timing diagrams illustrating simulated performance of the circuitry of FIG. 3 at 85 degrees centigrade.
Figure 4B:
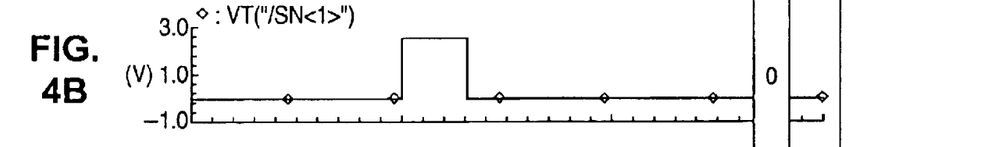
Figure 4C:
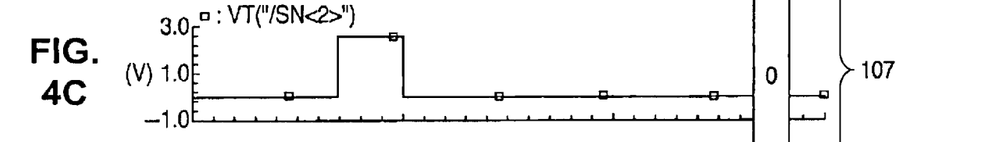
Figure 4D:
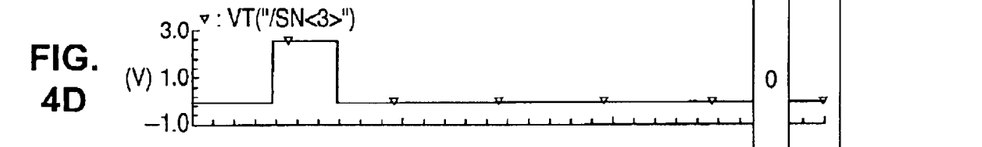
Figure 4E:
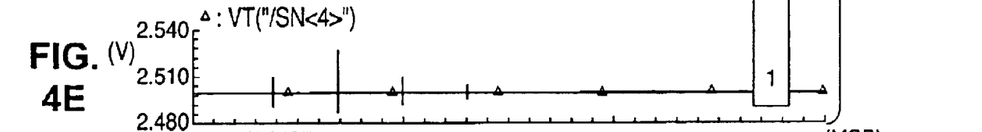
Figure 4F:
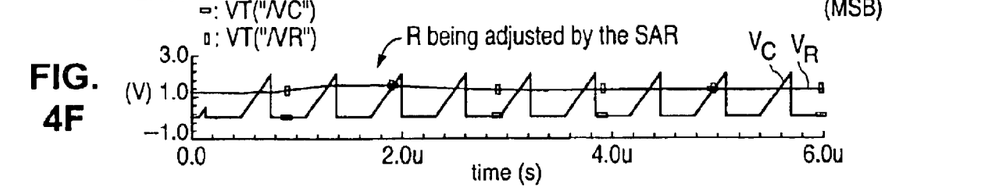
Figure 5A:
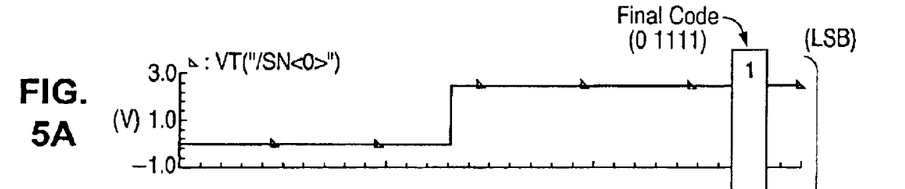
FIG. 5 contains signal timing diagrams illustrating simulated performance of the circuitry of FIG. 3 at −40 degrees centigrade.
Figure 5B:
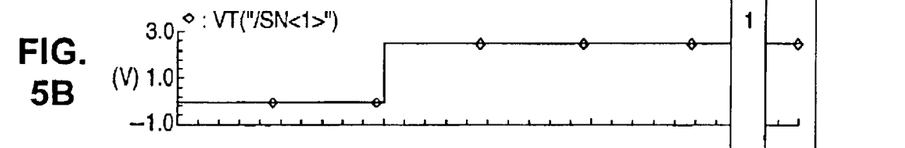
Figure 5C:
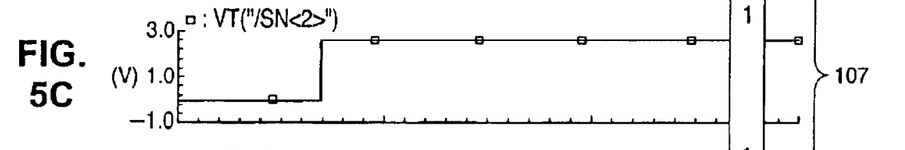
Figure 5D:
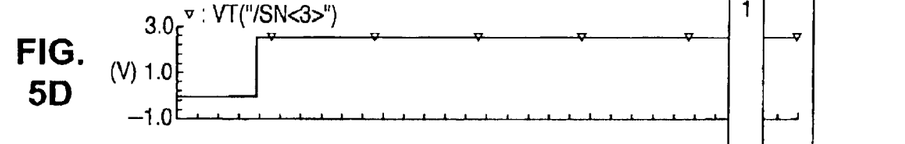
Figures 5E, 5F:
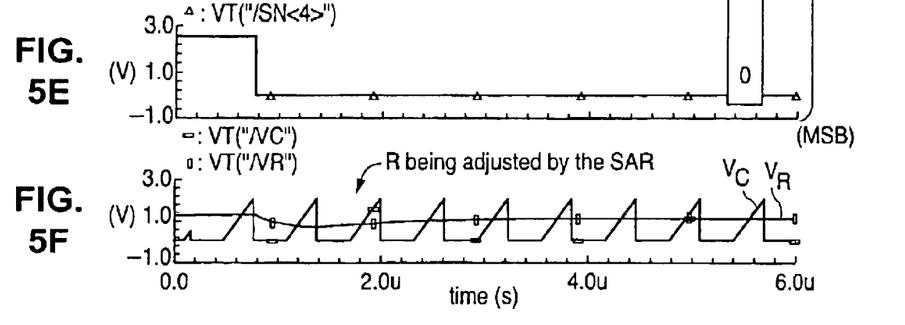

Referring to FIG. 3, a time constant-based calibration circuit for tuning active filters in accordance with one embodiment 100a of the presently claimed invention includes a tunable impedance circuit 102 (discussed in more detail below), a signal comparison circuit 104 and successive approximation circuitry 106 (e.g., a successive approximation register), all interconnected substantially as shown. Additionally, current replication circuitry 108, e.g., in the form of current mirror circuit 108a, can be included to provide the reference signals for the tunable impedance circuit 102. As will be discussed in more detail below, the digital tuning output signal 107 is used to tune the slave active filter 116 for filtering the input signal 11i to provide the filtered output signal 17.

The tunable impedance circuit 102 is an RC circuit in which a tunable resistive circuit 102r (discussed in more detail below) and a substantially fixed capacitive circuit 102c (e.g., a MOSFET connected as a capacitor in which the gate terminal serves as the upper capacitor plate and the drain and source terminals are connected together to serve as the lower capacitor plate connected to the lower power supply terminal VSS or circuit ground). The resistive circuit 102r (having resistance R) and capacitive circuit 102c (having capacitance C) receive mutually proportional reference signals in the form of currents $I_R$, $I_C$ (e.g., substantially equal as discussed in more detail below). Reception of these reference signals $I_R$, $I_C$ causes voltages to be generated across the resistive 102r and capacitive 102c circuits, thereby producing corresponding voltages $V_R$, $V_C$ which are compared in the signal comparison circuit 104. The resulting digital result signal 105 is processed by the successive approximation circuitry 106 in accordance with well known conventional successive approximation algorithm techniques. The resulting digital approximation signal 107 is fed back to the tunable impedance circuit 102 for tuning the resistive circuitry 102r (discussed in more detail below). Additionally, this signal 107 is used to tune the slave active filter circuitry 116 which contains matching slave resistive circuitry 116r (having resistance $R_S$) and capacitive circuitry 116c (having capacitance $C_S$). The terminal voltage $V_C$ across the capacitive circuitry 102c is reset by a shunt switch 102s every half cycle of an external clock signal CLK1 having a clock signal frequency $f_{CLK1}$. Accordingly, as the resistor current $I_R$ passes through the resistive circuitry 102r, the voltage $V_R$ across the resistive circuitry 102r remains constant so long as the resistive value R of the resistive circuitry 102r remains unchanged during a tuning iteration. Meanwhile, with the capacitive circuitry 102c being driven by a constant current $I_C$, the voltage $V_C$ across the capacitive circuitry 102c is a ramp signal which will be reset during the time that the clock signal CLK1 is asserted.

The switch 102s can be implemented in any of a number of well known conventional ways. For example, the switch 102s can be implemented as a simple pass transistor using a single MOSFET, or alternatively as a transmission gate using parallel-connected P-type and N-type MOSFETs, in accordance with well known conventional techniques.

As shown in this example, the reference signal currents $I_R$, $I_C$ can be provided as substantially equal currents generated by a current mirror circuit 108a. Such a circuit 108a includes a diode-connected P-type MOSFET (P-MOSFET) P1 which drives two additional P-MOSFETs P2, P3 in accordance with well known techniques. A master current source IS provides the input current I via an input cascode P-MOSFET P4. This input current I is mirrored by the action of P-MOSFETs P1, P2, and P3 which if equal in size produce equal output currents $I_R$, $I_C$ which are conveyed via output cascode P-MOSFETs P5 and P6. The cascode transistors P4, P5, P6 are biased by a bias voltage $V_b$. As indicated, all of the circuitry in this embodiment 100a is biased between an upper power supply terminal VDD and lower supply terminal VSS (or ground GND).

The current source IS can be implemented in a number of well known conventional ways, to ensure consistency and stability over variations in manufacturing processes, power supply voltage variations and operating temperatures (PVT). For example, a bandgap circuit, many of which are well known in the art, can be used as part of the biasing circuitry within the current source IS, thereby ensuring a consistent and stable reference current I over PVT.

Mathematically, the voltage drops $V_R$ across the resistive circuitry 102r and $V_C$ across the capacitive circuitry 102c (or perhaps more correctly, voltage variations $\Delta V_R$ and $\Delta V_C$) can be expressed as shown below in equations 1 and 2, where $\Delta R$ represents a change in the resistance value of the resistive circuitry 102r and $\Delta t$ represents the time interval over which the capacitive circuitry 102c is allowed to charge (e.g., the time interval during which the clock signal CLK1 is deasserted).

$$\Delta V_R = I \cdot \Delta R \quad \text{Eq. (1)}$$

$$\Delta V_C = \frac{1}{C} \cdot \Delta t \quad \text{Eq. (2)}$$

From equations 1 and 2, if $\Delta V_R = \Delta V_C$, it can be shown that $$\Delta t = \Delta R \cdot C \quad \text{Eq. (3)}$$

Since the corner frequency $f_0$ of an active filter can be expressed as $$f_0 \propto \frac{1}{RC} \quad \text{Eq. (4)}$$

the calibration of the corner frequency $f_0$ can be performed by measuring and adjusting the time constant $\Delta t$.

From the foregoing, it can be seen that it is important that the resistance R of the resistive circuitry 102r and capacitance 102c of the capacitive circuitry C in the tunable impedance circuit 102 be matched to the corresponding resistance $R_S$ and capacitance $C_S$, respectively, within the active filter 116 intended to be calibrated. Such a matching requirement can be achieved quite readily (e.g., within 1% if proper IC layout design techniques are employed).

The successive approximation circuitry 106 is clocked by a second clock signal CLK2 having a frequency $f_{CLK2}$ which is higher than the frequency $f_{CLK1}$ of the clock signal CLK1 driving the switch 102s within the tunable impedance circuit 102. Referring to FIGS. 4 and 5, simulations have shown that the closed loop transient performance of the circuitry of FIG. 3, using a five-bit successive approximation register 106 and operating at ambient temperatures of 85 and −40° C., respectively, is as illustrated. As shown, the five bits of the digital tuning signal 107 settle out at the final code value, while the voltage $V_R$ across the resistive circuitry 102r is also settled at its nominal value, all while the substantially constant ramp signal voltage $V_C$ is generated across the capacitive circuitry 102c with a waveshape as shown.

Figure 6A:
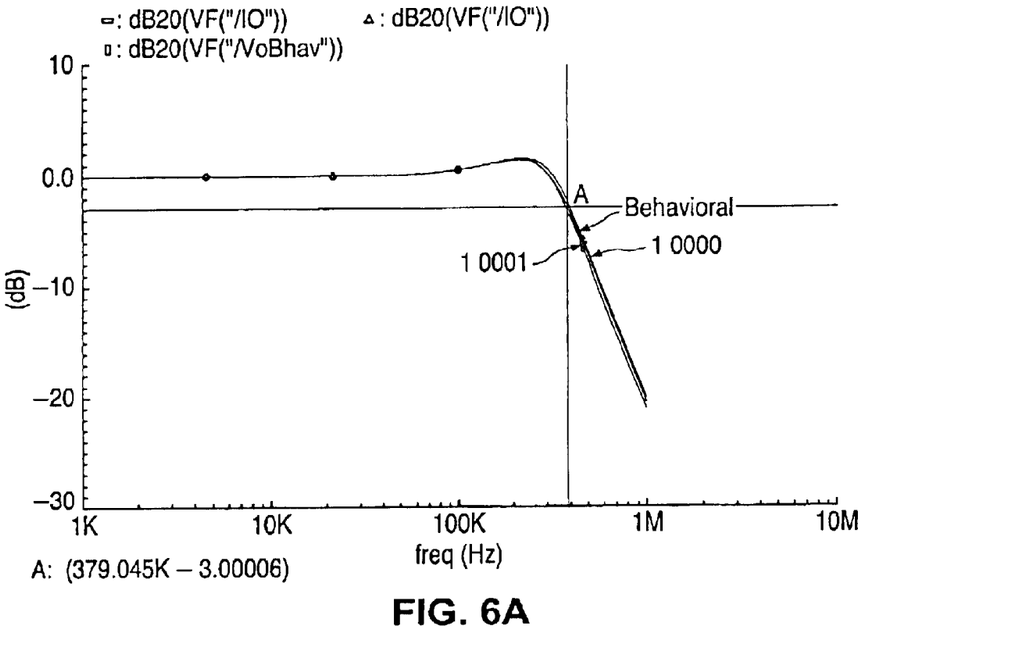
FIGS. 6A and 6B illustrate a magnitude versus frequency characteristic of a simulated second order active RC filter based upon the signals of FIG. 4.
Figure 6B:
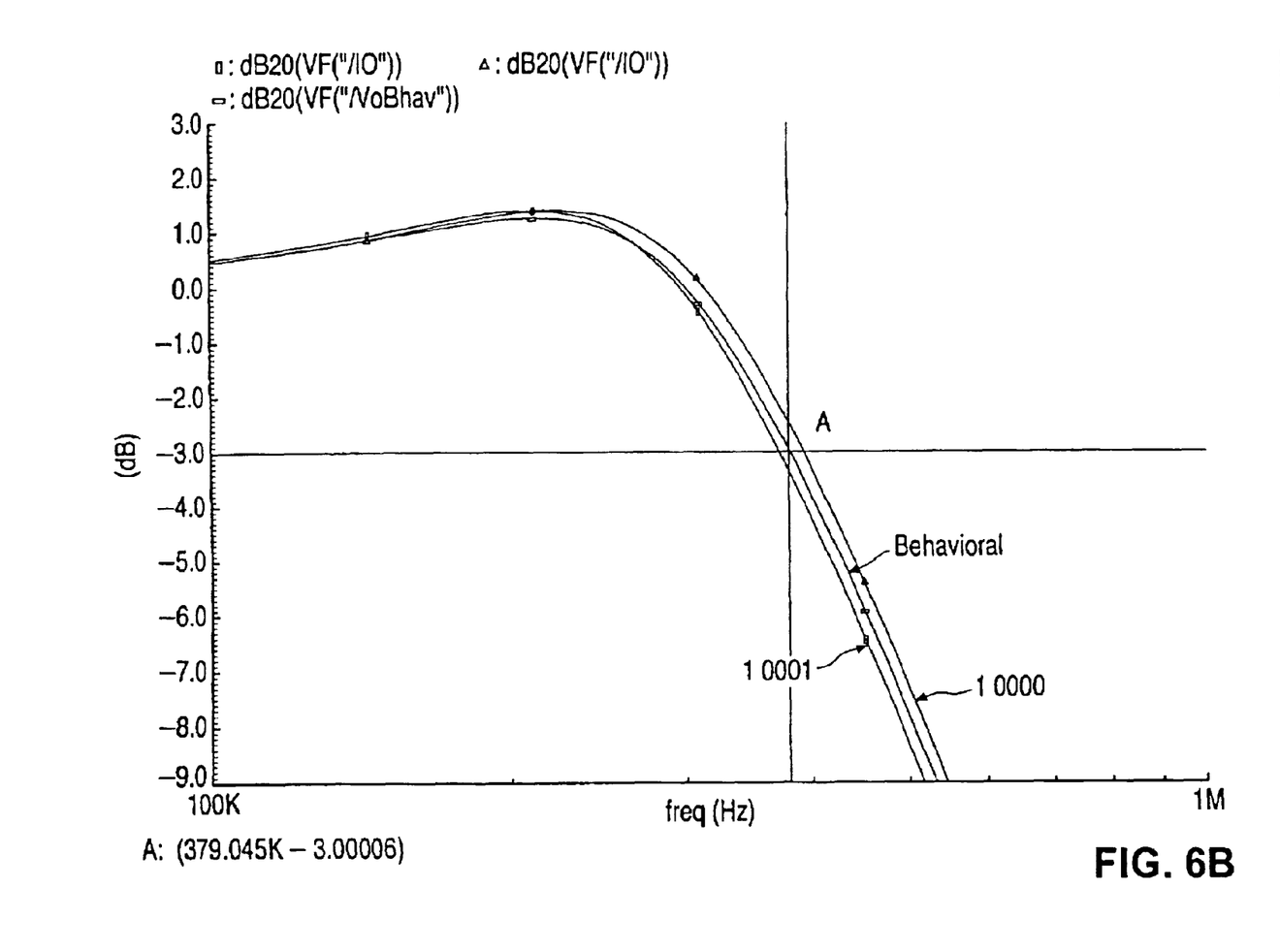
Figure 7A:
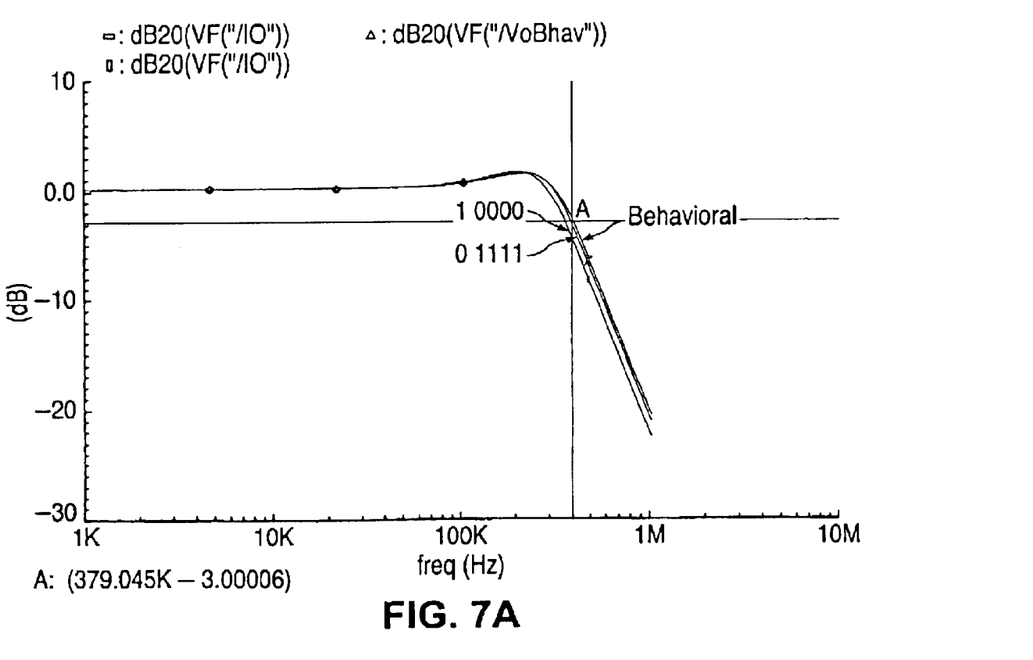
FIGS. 7A and 7B illustrate a magnitude versus frequency characteristic of a simulated second order active RC filter based upon the signals of FIG. 5.
Figure 7B:
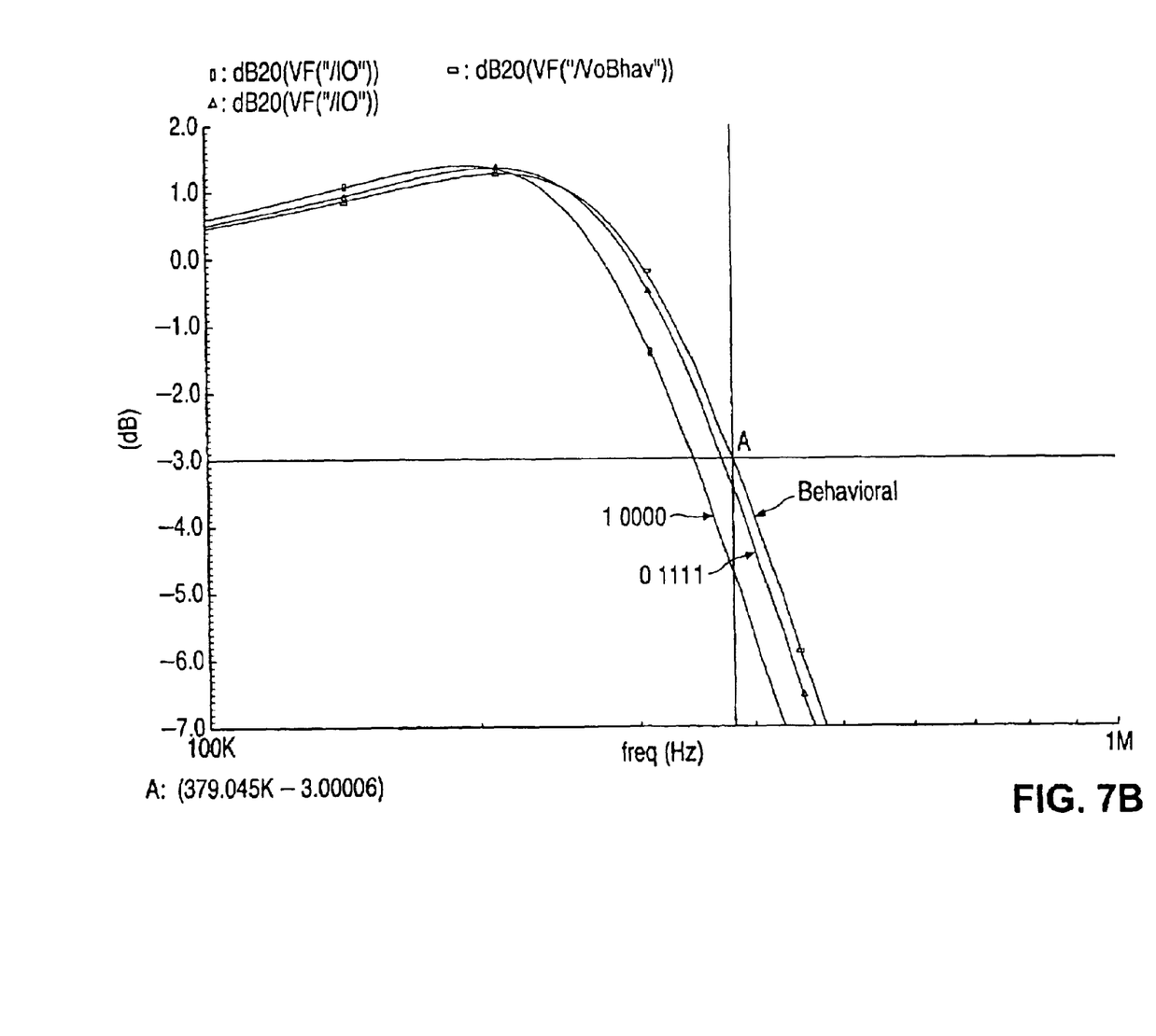

Referring to FIGS. 6A, 6B, 7A and 7B, the frequency responses of a simulated second order active RC lowpass filter (LPF) with the corresponding digital tuning signal 107 codes shown in FIGS. 4 and 5 are as illustrated. FIGS. 6A and 6B correspond to FIG. 4, and FIG. 6B is an expanded view of FIG. 6A at the frequency of interest. Similarly, FIGS. 7A and 7B correspond to FIG. 5, and FIG. 7B is an expanded view of FIG. 7A at the frequency of interest. Based upon these graphs, it can be seen that the corner frequency of the LPF 116 is being tuned to within a very close proximity of the desired frequency value.

Figure 8:
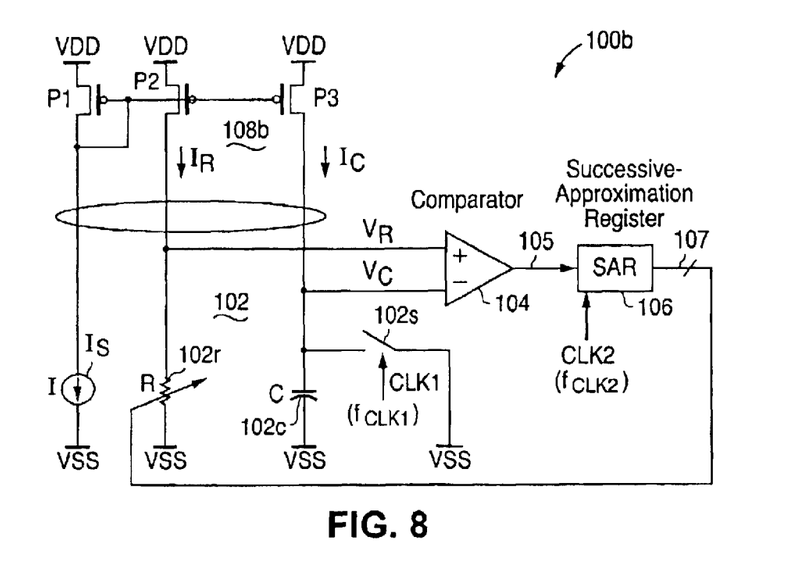
FIG. 8 is a schematic and functional block diagram of an alternative embodiment of the presently claimed invention.

Referring to FIG. 8, an alternative embodiment 100b of the presently claimed invention is similar to that depicted in FIG. 3. However, the current source circuitry 108b does not include the cascode transistors P4, P5, P6. All other operating characteristics are in conformance with the discussion above for FIG. 3.

Figure 9:
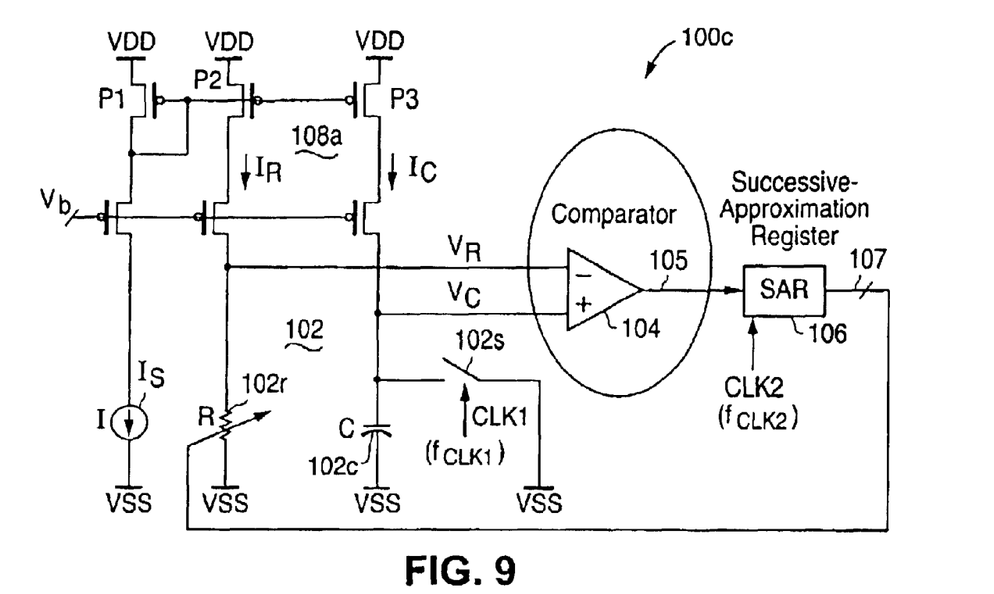
FIG. 9 is a schematic and functional block diagram of another alternative embodiment of the presently claimed invention.

Referring to FIG. 9, another alternative embodiment 100c of the presently claimed invention is also similar to that depicted in FIG. 3. In this embodiment 100c, the input terminals of the comparator circuitry 104 are reversed. All other operating characteristics are in conformance with the discussion above for FIG. 3.

Figure 10:
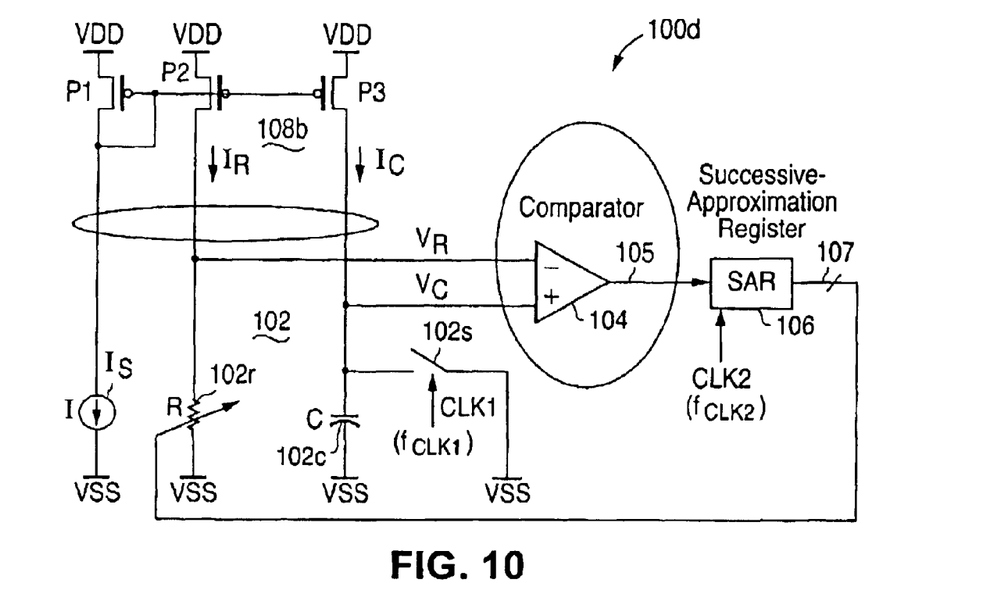
FIG. 10 is a schematic and functional block diagram of another alternative embodiment of the presently claimed invention.

Referring to FIG. 10, another alternative embodiment 100d of the presently claimed invention does not include the cascode transistors P4, P5, P6 as part of the current source circuitry 108b and the input terminals of the comparator circuitry 104 are reversed. All other operating characteristics are in conformance with the discussion above for FIG. 3.

Figure 11:
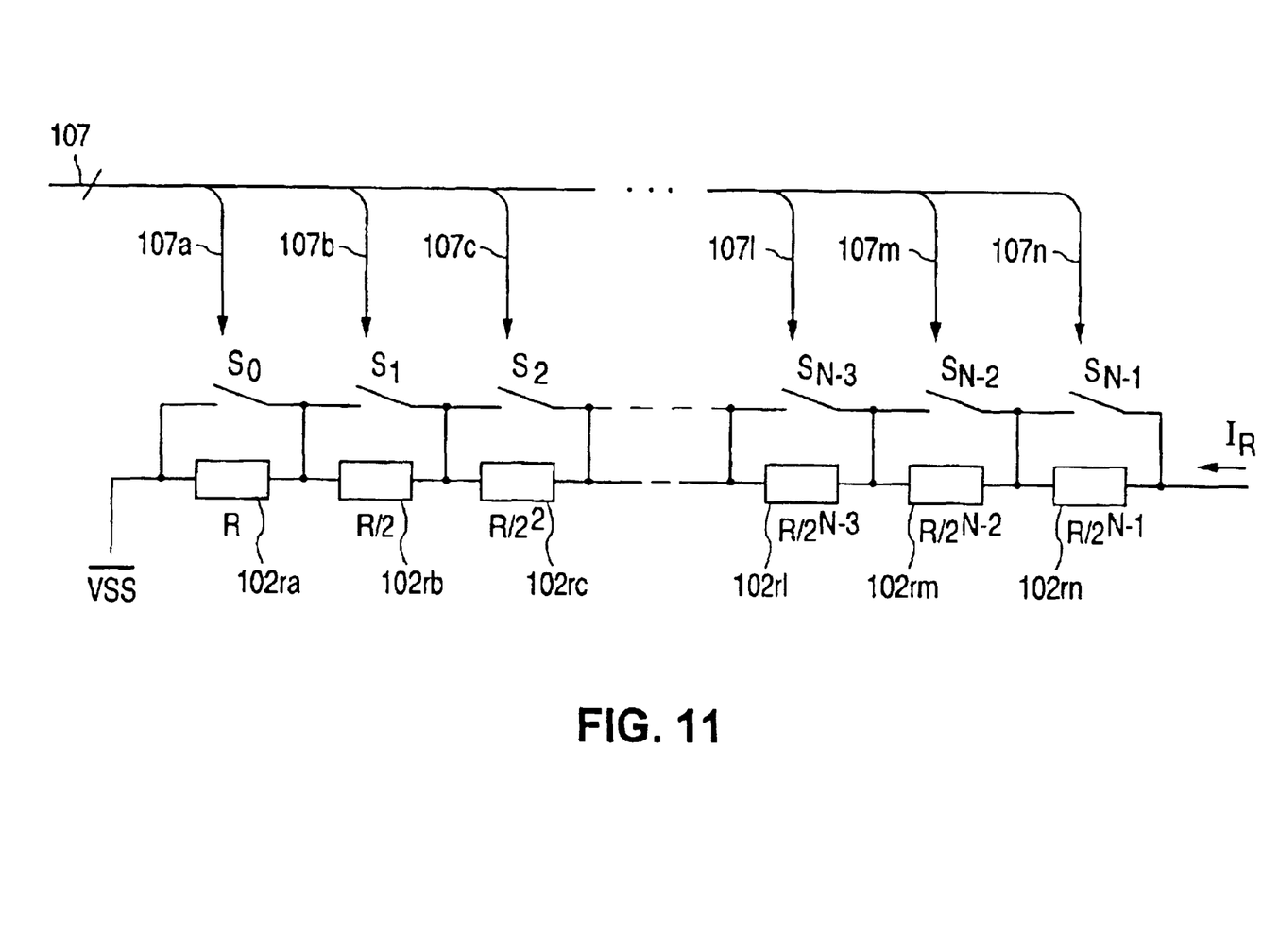
FIG. 11 is a schematic diagram of an exemplary implementation of the variable resistive circuitry in the circuits of FIGS. 3 and 8–10.

Referring to FIG. 11, the variable resistive circuitry 102r of the tunable impedance circuit 102 can be implemented as a serial arrangement of N resistors 102ra, 102rb, ..., 102rn with associated switches $S_0, S_1, ..., S_{N-1}$ connected in parallel, substantially as shown. The resistors 102ra, 102rb, ..., 102rn can be implemented in a number of well known conventional ways (e.g., as appropriately sized and biased MOSFETs), and are preferably binary weighted with values $R, R/2, R/2^2, ..., R/2^{(N-1)}$, as shown. (It will be appreciated that this is merely one example and that other combinations of resistors and switches can be used as well, depending upon the form of variable resistance desired.) The switches $S_0, S_1, ..., S_{N-1}$ also can be implemented in a number of well known conventional ways (e.g., as individual pass transistors or as transmission gates formed with parallel-connected P- and N-MOSFETs). Individual bits 107a, 107b, ..., 107n of the digital tuning signal 107 drive respective ones of the switches $S_0, S_1, ..., S_{N-1}$. Accordingly, for each asserted bit 107a, 107b, ..., 107n, the corresponding switch $S_0, S_1, ..., S_{N-1}$ is open, thereby causing its associated resistor 102ra, 102rb, ..., 102rn to add its resistance $R, R/2, R/2^2, ..., R/2^{(N-1)}$ to the overall resistance R of the variable resistive circuitry 102r.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including time constant-based calibration circuitry for tuning active filter circuitry, comprising:

tunable signal generator circuitry, having associated therewith a first controllable time constant, that responds to reception of a digital tuning control signal and first and second reference signals having mutually proportional respective DC values substantially independent of said digital tuning control signal by providing a DC signal and an AC signal, wherein said DC signal has a magnitude responsive to said digital tuning control signal and related to said first controllable time constant, and said AC signal has a predetermined waveshape with a temporally variant magnitude;

signal comparison circuitry, coupled to said tunable signal generator circuitry, that compares said DC and AC signals and in response thereto provides a digital result signal indicative of a difference between said DC and AC signal magnitudes; and successive approximation circuitry, coupled to said signal comparison circuitry, that responds to reception of said digital result signal by providing said digital tuning control signal indicative of an approximation corresponding to a plurality of successive values of said digital result signal.

2. The apparatus of claim 1, wherein said tunable signal generator circuitry comprises a selectively variable impedance.

3. The apparatus of claim 1, wherein said tunable signal generator circuitry comprises:

variably resistive circuitry that responds to reception of said digital tuning control signal and said first reference signal by exhibiting a controlled resistance and providing said DC signal; and variably capacitive circuitry that responds to reception of a clock signal and said second reference signal by exhibiting a plurality of capacitive states and providing said AC signal.

4. The apparatus of claim 3, wherein said variably resistive circuitry comprises a plurality of serially coupled resistive circuit elements coupled in parallel with switching circuitry responsive to at least a portion of said digital tuning control signal.

5. The apparatus of claim 3, wherein said variably capacitive circuitry comprises a capacitive circuit element coupled with switching circuitry responsive to said clock signal.

6. The apparatus of claim 1, wherein said first and second reference signals have substantially equal DC values.

7. The apparatus of claim 1, wherein said first and second reference signals comprise first and second DC currents.

8. The apparatus of claim 1, wherein said signal comparison circuitry comprises voltage comparator circuitry.

9. The apparatus of claim 1, wherein said successive approximation circuitry comprises a successive approximation register.

10. The apparatus of claim 1, further comprising current signal generator circuitry that provides first and second DC currents as said first and second reference signals.

11. The apparatus of claim 1, further comprising said active filter circuitry coupled to said successive approximation circuitry and having associated therewith a second controllable time constant responsive to reception of said digital tuning control signal such that said second controllable time constant corresponds to said first controllable time constant.

12. An apparatus including time constant-based calibration circuitry for tuning active filter circuitry, comprising:

tunable signal generator circuitry, having associated therewith a first controllable time constant, that responds to reception of a digital tuning control signal and first and second reference signals having mutually proportional respective DC value by providing a DC signal and an AC signal, wherein said DC signal has a magnitude responsive to said digital tuning control signal and related to said first controllable time constant, and said AC signal has a predetermined waveshape with a temporally variant magnitude;

signal comparison circuitry, coupled to said tunable signal generator circuitry, that compares said DC and AC signals and in response thereto provides a digital result signal indicative of a difference between said DC and AC signal magnitudes;

successive approximation circuitry, coupled to said signal comparison circuitry, that responds to reception of said digital result signal by providing said digital tuning control signal indicative of an approximation corresponding to a plurality of successive values of said digital result signal; and current signal generator that provides first and second DC currents as said first and second reference signals and includes
constant current source circuitry that provides a substantially constant DC reference current, and
current replication circuitry, coupled to said constant current source circuitry, that responds to reception of said DC reference current by providing said first and second DC currents as first and second replicas of said DC reference current.

13. An apparatus including time constant-based calibration circuitry for tuning active filter means, comprising:

tunable signal generator means, having associated therewith a first controllable time constant, for responding to reception of a digital tuning control signal and first and second reference signals having mutually proportional respective DC values substantially independent of said digital tuning control signal by generating a DC signal and an AC signal, wherein said DC signal has a magnitude responsive to said digital tuning control signal and related to said first controllable time constant, and said AC signal has a predetermined waveshape with a temporally variant magnitude;

signal comparison means for comparing said DC and AC signals and in response thereto generating a digital result signal indicative of a difference between said DC and AC signal magnitudes; and successive approximation means for responding to reception of said digital result signal by generating said digital tuning control signal indicative of an approximation corresponding to a plurality of successive values of said digital result signal.

14. The apparatus of claim 13, further comprising current signal generator means for generating first and second DC currents as said first and second reference signals.

15. The apparatus of claim 13, further comprising said active filter meats, having a second controllable time constant associated therewith, for responding to reception of said digital tuning control signal such that said second controllable time constant corresponds to said first controllable time constant.

16. A method of using time constant-based calibration for tuning active filter circuitry, comprising:

receiving a digital tuning control signal;

receiving first and second reference signals having mutually proportional respective DC values substantially independent of said digital tuning control signal;

generating a DC signal having a magnitude responsive to said digital tuning control signal and said first reference signal and related to a first controllable time constant;

generating an AC signal responsive to said second reference signal and having a predetermined waveshape with a temporally variant magnitude;

comparing said DC and AC signals and in response thereto generating a digital result signal indicative of a difference between said DC and AC signal magnitudes; and processing said digital result signal for generating said digital tuning control signal indicative of an approximation corresponding to a plurality of successive values of said digital result signal.

17. The method of claim 16, wherein:

said generating a DC signal having a magnitude responsive to said digital tuning control signal and said first reference signal and related to a first controllable time constant comprises controlling a variable resistance; and said generating an AC signal responsive to said second reference signal and having a predetermined waveshape with a temporally variant magnitude comprises controlling a variably capacitive circuit.

18. The method of claim 16, wherein said receiving first and second reference signals having mutually proportional respective DC values comprises receiving first and second DC currents.

19. The method of claim 16, further comprising generating first and second DC currents as said first and second reference signals.

20. The method of claim 16, further comprising controlling a second controllable time constant responsive to said digital tuning control signal such that said second controllable time constant corresponds to said first controllable time constant.

* * * * *

UNITED STATES PATENT AND TRADEMARK OFFICE
CERTIFICATE OF CORRECTION

PATENT NO. : 6,803,813 B1
DATED : October 12, 2004
INVENTOR(S) : Tien Ke Pham

It is certified that error appears in the above-identified patent and that said Letters Patent is hereby corrected as shown below:

Column 2,
Line 20, please delete "runes" and replace with -- tunes --.

Column 6,
Line 33, please delete "C.," and replace with -- C, --.

Column 8,
Line 37, please delete "value" and replace with -- values --.
Line 54, after "generator" please insert -- circuitry --.

Column 9,
Line 23, please delete "meats" and replace with -- means --.

Signed and Sealed this

Fifteenth Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,803,813 B1
DATED : October 12, 2004
INVENTOR(S) : Tien Ke Pham

It is certified that error appears in the above-identified patent and that said Letters Patent is hereby corrected as shown below:

Column 2,
Line 20, please delete "runes" and replace with -- tunes --.

Column 6,
Line 33, please delete "C.," and replace with -- C, --.

Column 8,
Line 37, please delete "value" and replace with -- values --.
Line 54, after "generator" please insert -- circuitry --.

Column 9,
Line 23, please delete "meats" and replace with -- means --.

Signed and Sealed this

Thirty-first Day of May, 2005

JON W. DUDAS
*Director of the United States Patent and Trademark Office*